(12) United States Patent
Gossett

(10) Patent No.: US 11,140,789 B2
(45) Date of Patent: Oct. 5, 2021

(54) INTEGRATED FRAME ASSEMBLY FOR MOBILE DEVICES

(71) Applicant: MICROSOFT TECHNOLOGY LICENSING, LLC, Redmond, WA (US)

(72) Inventor: Benjamin David Gossett, Shoreline, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 0 days.

(21) Appl. No.: 16/422,654

(22) Filed: May 24, 2019

(65) Prior Publication Data

US 2020/0375038 A1 Nov. 26, 2020

(51) Int. Cl.
*H05K 5/00* (2006.01)
*G03B 17/02* (2021.01)
(Continued)

(52) U.S. Cl.
CPC .......... *H05K 5/0004* (2013.01); *G03B 17/02* (2013.01); *H05K 5/0086* (2013.01);
(Continued)

(58) Field of Classification Search
CPC .. H05K 5/0004; H05K 7/1427; H05K 5/0086; H05K 5/03; H05K 5/0017;
(Continued)

(56) References Cited

U.S. PATENT DOCUMENTS 9,654,166 B2 5/2017 Watanabe
10,466,749 B1* 11/2019 Hendren ............... G06F 1/1635
(Continued)

FOREIGN PATENT DOCUMENTS

CN 207234857 U 4/2012
CN 204733200 U 10/2015
(Continued)

OTHER PUBLICATIONS

"International Search Report and Written Opinion Issued in PCT Application No. PCT/US20/028398", dated Jul. 1, 2020, 8 Pages.

*Primary Examiner* — Hung S. Bui
*Assistant Examiner* — Sagar Shrestha
(74) *Attorney, Agent, or Firm* — NovoTechIP International PLLC

(57) ABSTRACT

An integrated frame assembly can include an inner mounting frame having first, second, third sidewall, and fourth sidewalls, a first corner proximate the first and fourth sidewalls, a second corner proximate the first and second sidewalls, a third corner proximate the second and third sidewalls, and a fourth corner proximate the third and fourth sidewalls. Corner components can be connected to the inner mounting frame and include a first corner component proximate the first corner, a second corner component proximate the second corner, a third corner component proximate the third corner, and a fourth corner component proximate the fourth corner. An outer frame can surround the first, third sidewall, and fourth sidewalls. Housing(s) can be proximate to the first, second, third, or fourth sidewall to enhance structural rigidity of the integrated frame assembly. The housing(s) can include antenna(s) and speaker(s).

10 Claims, 3 Drawing Sheets

(51) Int. Cl.
*H05K 7/14* (2006.01)
*H01Q 1/24* (2006.01)
*H04R 1/02* (2006.01)
*H05K 5/03* (2006.01)

(52) U.S. Cl.
CPC ............ *H05K 7/1427* (2013.01); *H01Q 1/24* (2013.01); *H04R 1/025* (2013.01); *H04R 2499/11* (2013.01); *H05K 5/0017* (2013.01); *H05K 5/03* (2013.01)

(58) Field of Classification Search
CPC .......... G03B 17/02; H01Q 1/24; H04R 1/025; H04R 2499/11; G06F 1/1601; G06F 1/1626
See application file for complete search history.

(56) References Cited

U.S. PATENT DOCUMENTS

| | | | | |
|---|---|---|---|---|
| 2004/0042160 | A1* | 3/2004 | Yang | G06F 1/1635 361/679.02 |
| 2005/0179832 | A1* | 8/2005 | Kim | G02F 1/133308 349/58 |
| 2008/0297695 | A1* | 12/2008 | Sekiguchi | G02B 6/0078 349/65 |
| 2011/0165916 | A1* | 7/2011 | Park | H01Q 1/06 455/566 |
| 2012/0314152 | A1* | 12/2012 | Zhao | H05K 5/02 349/58 |
| 2013/0010405 | A1* | 1/2013 | Rothkopf | H05K 5/0226 361/679.01 |
| 2013/0017865 | A1* | 1/2013 | Allore | H01Q 1/243 455/566 |
| 2013/0044451 | A1* | 2/2013 | Tang | G06F 1/1626 361/807 |
| 2013/0162124 | A1* | 6/2013 | Miyaoka | H05K 5/0217 312/223.1 |
| 2013/0165189 | A1* | 6/2013 | Shoji | G06F 1/16 455/575.1 |
| 2013/0176674 | A1* | 7/2013 | Brogan | G06F 1/1601 361/679.27 |
| 2013/0217444 | A1* | 8/2013 | Lee | G06F 1/1635 455/566 |
| 2014/0239781 | A1* | 8/2014 | Allore | B29C 45/14311 312/223.1 |
| 2014/0302890 | A1 | 10/2014 | Lai et al. | |
| 2014/0362554 | A1* | 12/2014 | Rikiishi | G09F 9/302 361/809 |
| 2015/0373441 | A1* | 12/2015 | Behles | G06F 1/1688 381/333 |
| 2018/0054903 | A1* | 2/2018 | Yamamoto | H05K 5/0217 |
| 2018/0338021 | A1* | 11/2018 | Hebert | G06F 1/1626 |
| 2019/0129236 | A1* | 5/2019 | Kim | H04M 1/0266 |
| 2019/0132973 | A1 | 5/2019 | Lee et al. | |

FOREIGN PATENT DOCUMENTS

| | | |
|---|---|---|
| CN | 204810332 U | 11/2015 |
| CN | 205545436 U | 8/2016 |
| CN | 206272670 U | 6/2017 |

\* cited by examiner

INTEGRATED FRAME ASSEMBLY FOR MOBILE DEVICES

BACKGROUND

This disclosure pertains to the field of systems and methods for an integrated frame assembly for mobile devices.

Most frame concepts for consumer electronics are constructed of plastic and/or metallic materials. Homogenous plastic frames are transparent to radio frequencies (RF) but are bulky and susceptible to breaking or cracking when dropped. Metallic frames are not transparent to radio frequencies, but the material properties are stronger which lends to a product that is thinner, stronger, and resistant to damage when dropped by a consumer. Hence, there is a need for an integrated frame assembly for mobile devices that is compact, lightweight, durable, and transparent to radio frequencies.

SUMMARY

In one general aspect, the systems and techniques disclosed herein are directed to an integrated frame assembly for a mobile device including an inner mounting frame formed of metal and having a first sidewall, a second sidewall, a third sidewall, and a fourth sidewall, a first corner proximate the first sidewall and the fourth sidewall, a second corner proximate the first sidewall and the second sidewall, a third corner proximate the second sidewall and the third sidewall, a fourth corner proximate the third sidewall and the fourth sidewall, a top surface adapted to have a printed circuit board mounted thereon, and a bottom surface opposite the top surface. The integrated frame assembly can include corner components reinforced with metal, the corner components being connected to the inner mounting frame, the corner components including a first corner component proximate the first corner, a second corner component proximate the second corner, a third corner component proximate the third corner, and a fourth corner component proximate the fourth corner. A seamless non-metallic outer frame can surround the first sidewall, the third sidewall, and the fourth sidewall. One or more non-metallic housings can be proximate to the first sidewall, the second sidewall, the third sidewall, or the fourth sidewall to enhance structural rigidity of the integrated frame assembly. The non-metallic housing(s) can include one or more speakers and one or more antennas.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

The drawing figures depict one or more implementations in accord with the present teachings, by way of example only, not by way of limitation. In the figures, like reference numerals refer to the same or similar elements. Furthermore, it should be understood that the drawings are not necessarily to scale.

DETAILED DESCRIPTION

In the following detailed description, numerous specific details are set forth by way of examples in order to provide a thorough understanding of the relevant teachings. However, it should be apparent that the present teachings may be practiced without such details. In other instances, well known methods, procedures, components, and/or circuitry have been described at a relatively high-level, without detail, in order to avoid unnecessarily obscuring aspects of the present teachings.

A frame assembly for a mobile device described herein may be composed of multiple components that provide a transparent view for radio frequencies. The frame can allow for the integration of structural components, audio speakers and a seamless cosmetic overlay around the perimeter of the frame. In at least one implementation, antenna and speaker components are positioned towards the periphery of the device such that the antenna and speaker components provide a secondary role of functioning as part of the outer frame. Having antenna and speaker components that can serve multiple roles saves both space and weight in the design of a mobile device. For instance, the other outer frame components can be made smaller and lighter because the antenna and speaker components can be structurally part of the frame.

In addition to enhancing structural rigidity and durability of the device, positioning the antenna component towards the periphery of the device improves the functionality of the antenna component. Therefore, a smaller and lighter antenna component can be utilized. Additionally, the entire mobile device does not have to be designed to be transparent to radio frequencies, thereby removing a significant requirement of mobile device design.

Figure 1:
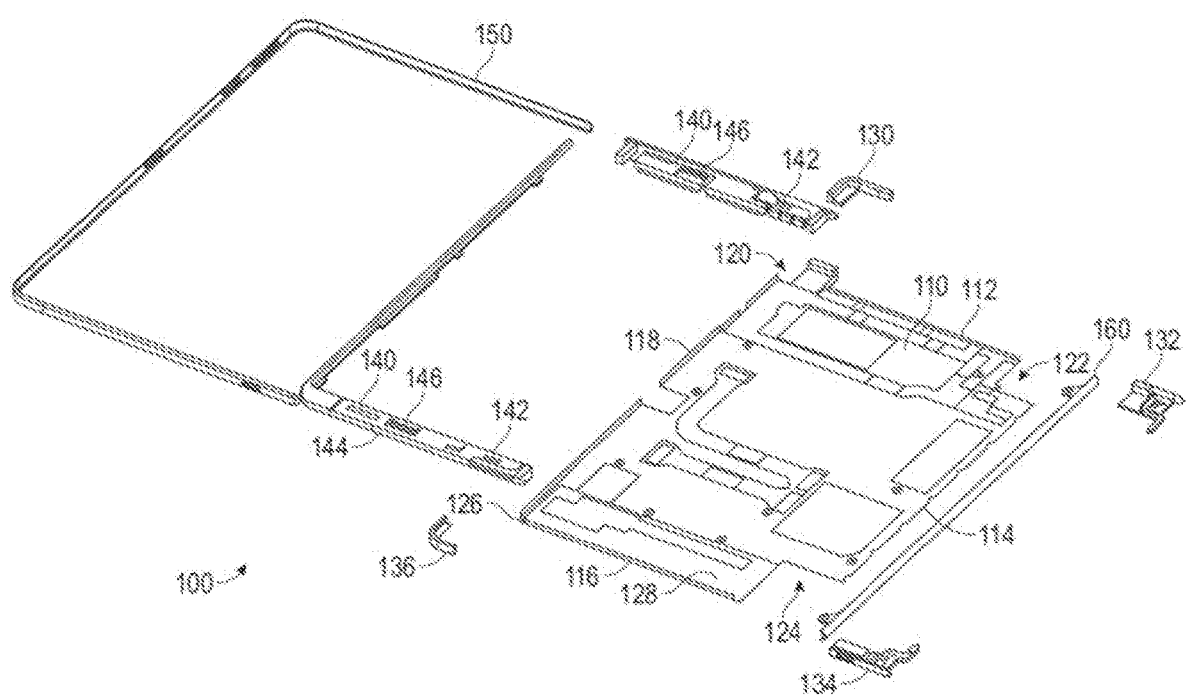
FIG. 1 is a diagram illustrating an integrated frame assembly in an exploded view in accord with aspects of the disclosure, where corner components, housings, an RF transparent region, a frame side component, an inner sheet metal mounting frame, and an outer frame are shown.

FIG. 1 is a diagram illustrating an integrated frame assembly 100 in an exploded view in accord with aspects of the disclosure, where the integrated frame assembly 100 includes an inner mounting frame 110, corner components 130, 132, 134, 136, one or more housings 140, an outer frame 150, and a frame side component 160. The components of the integrated frame assembly 100 can be attached to one another via fasteners, such as, for example, glue, solder, and/or screws.

The inner mounting frame 110 can be formed from a flat piece of sheet metal having a thickness between 0.1 and 0.2 millimeters (mm). The inner mounting frame 110 can include a first sidewall 112, a second sidewall 114, a third sidewall 116, and a fourth sidewall 118. The inner metal mounting frame 110 can further include a first corner 120 proximate the first sidewall 112 and the fourth sidewall 118, a second corner 122 proximate the first sidewall 112 and the second sidewall 114, a third corner 124 proximate the second sidewall 114 and the third sidewall 116, and a fourth corner 126 proximate the third sidewall 116 and the fourth sidewall 118. The inner mounting frame 110 can include a top surface 128 and a bottom surface (not shown), where the top surface 128 can be adapted to mount a printed circuit board thereon.

The corner components 130, 132, 134, and 136 can be reinforced with metal components to enhance structural rigidity. In at least one implementation, the integrated frame assembly 100 is surrounded by glass on both sides. For instance, the mobile device can include a top glass component proximate top surface 128 of the inner mounting frame 110, which functions as the display screen, a bottom glass component proximate the bottom surface of the inner mounting frame 110 (e.g., for aesthetic purposes). The reinforced metal components of the corner components 130, 132, 134, and 136 may not compress if the mobile device is dropped and lands on one of its corners.

The housing(s) 140 can be non-metallic structures that protect and enclose one or more speakers 142. The speakers 142 can provide audio output for the mobile device. In at least one implementation, integrated frame assembly 100 includes an L-shaped plastic housing 144. The L-shaped plastic housing 144 protects and encloses one or more of the speakers 142. The housing(s) 140 and/or 144 can also include an antenna 146. The antenna 146 provides communications capabilities (input and output) to the mobile device. The outer frame 150 and the frame side component 160 can provide structural rigidity to the mobile device. The outer frame 150 can be formed from a single piece of thin, compressible, and shock-absorbing material (e.g., rubber). More specifically, the outer frame can have a thickness of less than 1.0 mm. In at least one implementation, the outer frame has a thickness of 0.8 mm. The outer frame 150 can be formed from non-metallic material to decrease the weight and improve the RF transparency of the integrated frame assembly 100. The frame side component 160 can be formed from thin, lightweight, yet rigid material (e.g. plastic).

Figure 2:
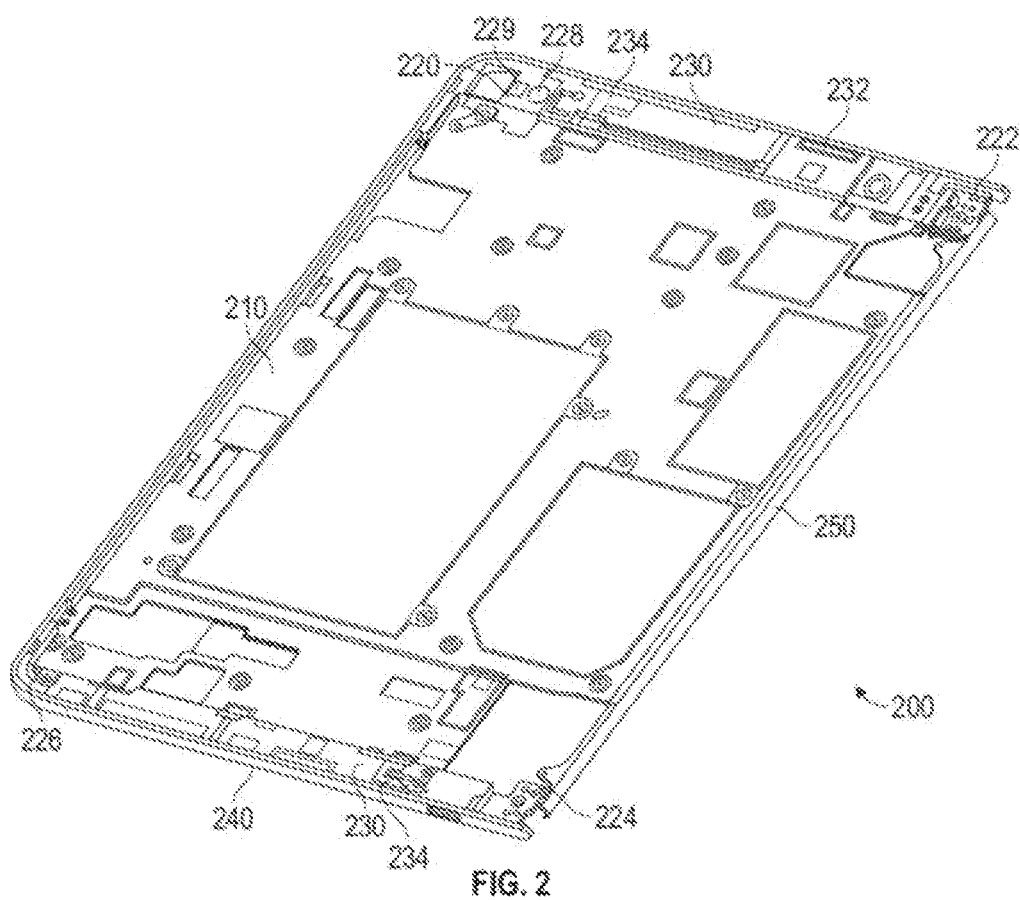
FIG. 2 is a diagram illustrating an integrated frame assembly in accord with aspects of the disclosure, where corner components, a housing, an RF transparent region, a frame side component, an inner sheet metal mounting frame, and an outer frame are shown.

FIG. 2 is a diagram illustrating an integrated frame assembly 200 in accord with aspects of the disclosure, where the integrated frame assembly 200 includes an inner mounting frame 210, corner components 220, 222, 224, 226, one or more housings 230, an outer frame 240, and a frame side component 250. The components of the integrated frame assembly 200 can be attached to one another via fasteners, such as, for example, glue, solder, and/or screws.

In at least one implementation, the corner components are connected to the inner metal mounting frame 210, where a first corner component 220 is proximate a first corner of the inner mounting frame 210, a second corner component 222 is proximate a second corner of the inner mounting frame 210, a third corner component 224 is proximate a third corner of the inner mounting frame 210, and a fourth corner component 226 is proximate a fourth corner of the inner mounting frame 210.

The corner components 220, 222, 224, and 226 can be connected to a top surface of the inner mounting frame 210. In another implementation, the corner components 220, 222, 224, and 226 are connected to sidewalls of the inner mounting frame 210. For instance, the first corner component 220 can be attached to a first sidewall and a fourth sidewall of the inner mounting frame 210, the second corner component 222 can be attached to the first sidewall and a second sidewall of the inner mounting frame 210, the third corner component 224 can be attached to the second sidewall and a third sidewall of the inner mounting frame 210, and the fourth corner component 226 can be attached to the third sidewall and the fourth sidewall of the inner mounting frame 210. As used herein, the term "connected" can include operationally connected, logically connected, in communication with, physically or wirelessly connected, engaged, coupled, contacts, linked, affixed, and attached.

A first aperture 228 and a second aperture 229 can be formed in the first corner component 220. Although FIG. 2 illustrates a circular first aperture 228 and a square-shaped second aperture 229, it is recognized that the first aperture 228 and the second aperture 229 could be formed in other shapes, such as, for example, ovular or rectangular. The integrated frame assembly 200 can include a camera lens proximate the first aperture 228 and a light source proximate the second aperture 229. In at least one implementation, the first corner component 220 can include a third aperture for a second camera or a second light source. Although FIG. 2 illustrates that the first corner component 220 includes the apertures for the camera lens and light source, it is recognized that the apertures could be positioned on the second corner component 222, the third corner component 224, and/or the fourth corner component 226, and the corresponding camera lens and light source can be positioned proximate the apertures. In another implementation, the first corner component 220, the second corner component 222, the third corner component 224, and the fourth corner component 226 lack the second aperture 229, where both the camera lens and the light source are proximate the first aperture 228.

The housing(s) 230 can serve multiple roles of (1) providing audio output (via speaker 232); (2) providing communications capabilities (via antennas 234); and, (3) providing lightweight structural rigidity to the periphery of the inner mounting frame 210, thereby saving space and enabling a lighter weight mobile device. Although FIG. 2 illustrates an integrated frame assembly having one speaker and two antennas, it is recognized that the integrated frame assembly could have any number of speakers and antennas. FIG. 2 illustrates a first housing 230 proximate the first sidewall of the inner mounting frame 210 and a second housing 230 proximate the third sidewall of the inner mounting frame 210. It is recognized, that the integrated frame assembly 200 could have any number of housings 230, where the housing(s) 230 are proximate to the first sidewall of the inner mounting frame 210, the second sidewall of the inner mounting frame 210, the third sidewall of the inner mounting frame 210, and/or the fourth sidewall of the inner mounting frame 210.

The housing(s) 230 can be connected to a top surface of the inner mounting frame 210. In at least one implementation, the housing 230 is located within 2.0 millimeters of the sidewall that it is closest to (i.e., the first sidewall, the second sidewall, the third sidewall, or the fourth sidewall). The housing(s) 230 can have outer sidewalls that are flush and contiguous with adjacent outer sidewalls of the inner mounting frame 210. In another implementation, the housing(s) 230 are in direct contact with the sidewall(s) that they are closest to. For instance, the housing(s) 230 can be connected to the first sidewall and the fourth sidewall of the inner mounting frame 210.

The integrated frame assembly 200 can include one or more radio frequency keep-out zones that are free of metal components, where the antennas 234 are positioned in the radio frequency keep-out zone(s). The antennas 234 can be printed onto the exterior of the housing 230 using laser direct structuring (LDS). In the example illustrated in FIG. 2, the housings 230 serve as the radio frequency keep-out zones. It is recognized that in another implementation, a radio frequency keep-out zone could be larger than the housing 230.

The outer frame 240 can be a seamless, unitary component connected to the first sidewall, the third sidewall, and the fourth sidewall of the inner mounting frame 210. The frame side component 250 can be located proximate the second sidewall of the inner mounting frame 210. Specifically, an inner wall of the frame side component 250 can be directly connected to the second sidewall of the inner mounting frame 210. In another implementation, the frame side component 250 is connected to the outer frame 240 at terminal ends of the frame side component 250, such that the frame side component 250 is configured to swivel/rotate along its longitudinal axis. The frame side component 250 can be configured to connect (e.g., via a magnet or male and female connectors) to a corresponding side component of an integrated frame assembly of a complementary mobile device. Accordingly, in at least one implementation, the assembled device includes two integrated frame assemblies that are hingedly connect at their respective frame side components, where the assembled device can fold at the connection point.

Figure 3:
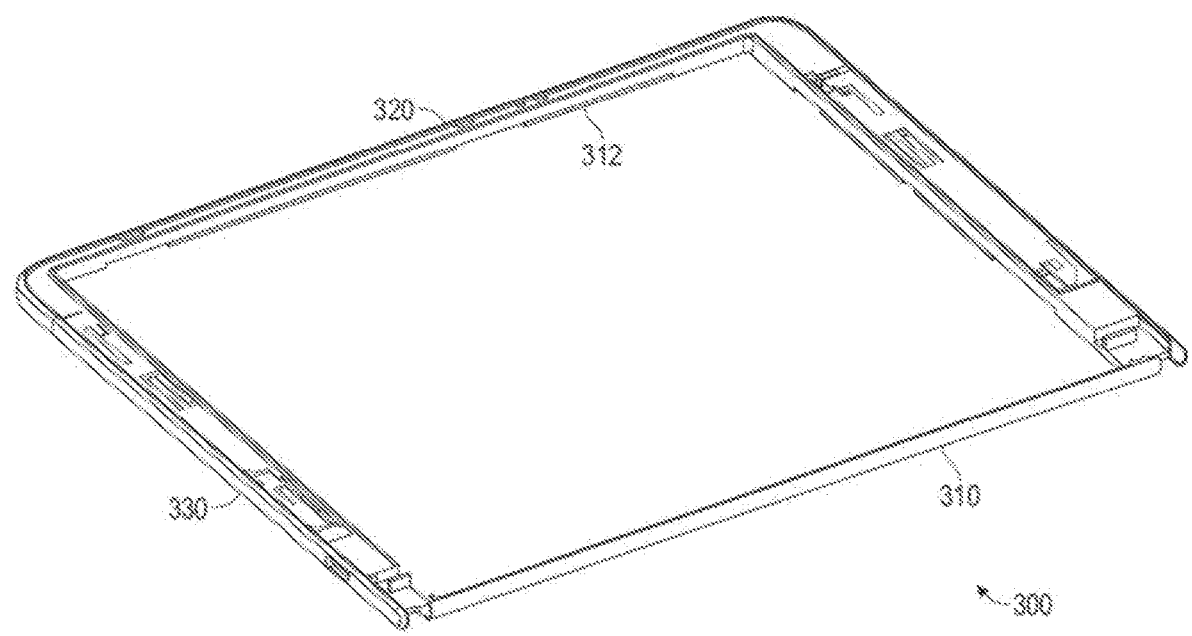
FIG. 3 is a diagram illustrating a portion of an integrated frame assembly in accord with aspects of the disclosure, where an inner frame, an RF transparent region, and an outer frame are shown.

FIG. 3 is a diagram illustrating a portion of an integrated frame assembly 300 including an inner frame 310, an RF transparent region 320, and an outer frame 330. The inner frame 310 can be substantially rectangular shape and can be formed from rigid, lightweight, and non-metallic material (e.g., plastic). The inner frame 310 can include an inner surface walls 312 and outer surface walls (not shown). The outer surface walls of the inner frame 310 can be connected to inner surface walls of the RF transparent region 320.

In at least one implementation, the RF transparent region 320 is a three-sided C-shaped frame formed from rigid, lightweight, and non-metallic material (e.g., plastic). The RF transparent region 320 can enhance the structural rigidity of the integrated frame assembly 300 and provide a housing for antenna(s) and/or speakers. The RF transparent region 320 can have outer surface walls that are connected to inner surface walls of the outer frame 330. In at least one implementation, the outer frame 330 is a seamless, three-sided C-shaped coating formed from a single piece of thin, compressible, and shock-absorbing material (e.g., rubber).

While various implementations have been described, the description is intended to be exemplary, rather than limiting, and it is understood that many more implementations and implementations are possible that are within the scope of the implementations. Although many possible combinations of features are shown in the accompanying figures and discussed in this detailed description, many other combinations of the disclosed features are possible. Any feature of any implementation may be used in combination with or substituted for any other feature or element in any other implementation unless specifically restricted. Therefore, it will be understood that any of the features shown and/or discussed in the present disclosure may be implemented together in any suitable combination. Accordingly, the implementations are not to be restricted except in light of the attached claims and their equivalents. Also, various modifications and changes may be made within the scope of the attached claims.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various examples for the purpose of streamlining the disclosure. This method of disclosure is not to be interpreted as reflecting an intention that the claims require more features than are expressly recited in each claim. Rather, as the following claims reflect, inventive subject matter lies in less than all features of a single disclosed example. Thus the following claims are hereby incorporated into the Detailed Description, with each claim standing on its own as a separately claimed subject matter.

What is claimed is:

1. A frame assembly comprising:
   an inner frame comprising:
      a main surface facing in a first direction; and
      a plurality of sidewalls extending from edge portions of the main surface in the first direction and comprising first, second, third and fourth sidewalls, each sidewall comprising inner and outer side surfaces facing mutually opposite directions, respectively, the inner side surfaces of the sidewalls facing a space over the main surface, the first and third sidewalls facing each other and the second and fourth sidewalls facing each other;

a first housing extending along the first and second sidewalls of the inner frame and enclosing a first antenna and a first speaker;

a second housing extending along the third sidewall of the inner frame and enclosing a second antenna and a second speaker;

an outer frame extending along the first and second housings, wherein the first and second housings are sandwiched between the inner frame and the outer frame; and a frame side component extending along the fourth sidewall of the inner frame and spaced apart from the first and second housings and the outer frame.

2. The frame assembly of claim 1, wherein the first housing is in contact with the outer side surfaces of the first and second sidewalls of the inner frame.

3. The frame assembly of claim 1, wherein the first and second housing comprises a radio frequency keep-out zone, wherein the first and second antennas are positioned in the radio frequency keep-out zone.

4. The frame assembly of claim 1, wherein the outer frame is composed of a non-metallic material.

5. The frame assembly of claim 1, wherein the outer frame has a thickness of less than 1 mm.

6. The frame assembly of claim 1, further comprising:

a plurality of corner components connected to a plurality of corners of the inner frame, respectively, the plurality of corner components comprising a first corner component including an aperture; and a camera lens positioned proximate to the aperture.

7. The frame assembly of claim 1, wherein the second housing is in contact with the outer side surface of the third sidewall of the inner frame.

8. The frame assembly of claim 1, further comprising a printed circuit board mounted on the main surface of the inner frame.

9. A device comprising the frame assembly of claim 1.

10. A mobile device comprising the frame assembly of claim 1.

* * * * *